US010585155B2

(12) United States Patent
Wang et al.

(10) Patent No.: US 10,585,155 B2
(45) Date of Patent: Mar. 10, 2020

(54) MAGNETIC RESONANCE IMAGING SWITCHING POWER AMPLIFIER SYSTEM AND METHODS

(71) Applicant: General Electric Company, Schenectady, NY (US)

(72) Inventors: Ruxi Wang, Cohoes, NY (US); Xiaohu Liu, Newton, MA (US); Han Peng, Niskayuna, NY (US); Fengfeng Tao, Clifton Park, NY (US); Juan Antonio Sabate, Wilton, NY (US)

(73) Assignee: General Electric Company, Schenectady, NY (US)

( * ) Notice: Subject to any disclaimer, the term of this patent is extended or adjusted under 35 U.S.C. 154(b) by 210 days.

(21) Appl. No.: 15/634,598

(22) Filed: Jun. 27, 2017

(65) Prior Publication Data

US 2018/0372819 A1  Dec. 27, 2018

(51) Int. Cl.
  *G01R 33/385* (2006.01)
  *G01R 33/36* (2006.01)
  *G01R 33/422* (2006.01)

(52) U.S. Cl.
  CPC ......... *G01R 33/3852* (2013.01); *G01R 33/36* (2013.01); *G01R 33/3856* (2013.01); *G01R 33/422* (2013.01)

(58) Field of Classification Search
  CPC ............ G01R 33/3854; G01R 33/4822; G01R 33/4833; G01R 33/5617; G01R 33/4826
  See application file for complete search history.

(56) References Cited

U.S. PATENT DOCUMENTS 6,291,997 B1    9/2001  King et al.
6,930,483 B2    8/2005  Sabate et al.
(Continued)

FOREIGN PATENT DOCUMENTS

WO    2016040596 A1    3/2016
WO    2016069555 A1    5/2016

OTHER PUBLICATIONS

Morris, Garron K., et al.; "Design of a Robust Cold Plate for High-Power Gradient Drivers in Magnetic Resonance Imaging Systems", The Tenth Intersociety Conference on Thermal and Thermo mechanical Phenomena in Electronics Systems, May 30-Jun. 2, 2006.

(Continued)

*Primary Examiner* — Christopher P McAndrew
*Assistant Examiner* — Zannatul Ferdous

(57) ABSTRACT

This disclosure regards a magnetic resonance imaging system including a scanner, and gradient drivers. The scanner is to be implemented within a scan room that is shielded from electromagnetic interference. Gradient coils are designed to create a linear gradient in the magnetic field generated in the scanner by a primary magnet. These coils are energized by gradient drivers. The gradient drivers use transformers and other electrical devices in a switching stage configured to generate pulse-width-modulated power. The transformers may have non-magnetic cores to facilitate implementing the gradient drivers within the scan room. The gradient drivers also use a filtering stage which uses inductors and other electrical devices to smooth the pulse-width-modulated power. The inductors within the filters may have non-magnetic cores to facilitate implementing the gradient driver within the scan room. Additionally, an inductor with a hollow wire may be used to circulate fluid to facilitate cooling the gradient driver.

8 Claims, 4 Drawing Sheets

(56) References Cited

U.S. PATENT DOCUMENTS

| | | | |
|---|---|---|---|
| 2007/0290687 A1 | 12/2007 | Kawachi et al. | |
| 2010/0079230 A1* | 4/2010 | Brubaker | H01F 37/00 336/196 |
| 2011/0009733 A1* | 1/2011 | Susi | A61M 5/14228 600/411 |
| 2011/0187369 A1 | 8/2011 | Rivas et al. | |
| 2011/0254551 A1 | 10/2011 | Leussler | |
| 2012/0007571 A1* | 1/2012 | Huisman | G01R 33/3852 323/271 |
| 2013/0099788 A1* | 4/2013 | Xu | G01R 33/3852 324/322 |
| 2013/0162250 A1 | 6/2013 | Sabate et al. | |
| 2014/0184372 A1* | 7/2014 | Mathieu | G01R 33/3856 336/60 |
| 2016/0187411 A1 | 6/2016 | Wiza et al. | |
| 2017/0067976 A1* | 3/2017 | Ward | G01R 33/4808 |
| 2017/0094769 A1* | 3/2017 | Eckert | H05H 1/2406 |

OTHER PUBLICATIONS

Zhu, Pengcheng, et al.;; "Multi-Output Power Supply With Series Voltage Compensation Capability for Magnetic Resonance Imaging System", IEEE 6th International Power Electronics and Motion Control Conference, IPEMC '09, May 17-20, 2009.

Lai, Rixin, et al.; "High Performance Gradient Driver for Magnetic Resonance Imaging System", IEEE Energy conversion Congress and Exposition (ECCE), Sep. 17-22, 2011.

* cited by examiner

MAGNETIC RESONANCE IMAGING SWITCHING POWER AMPLIFIER SYSTEM AND METHODS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a magnetic resonance imaging (MRI) system may provide sub-surface imaging based on interaction of electromagnetic waves (e.g., radio frequency signal) and a magnetic field. For example, an MRI system may include a primary magnet that generates a primary magnetic field, one or more gradient coils that interact with the primary magnetic field to produce magnetic gradients, a radio frequency transmitter (e.g., coil or antenna) that outputs a radio frequency (RF) signal into the magnetic field, and a radio frequency receiver (e.g., coil or antenna) that receives the radio frequency signal as it passes through the primary magnetic field. Based at least in part on the radio frequency signal received by the radio frequency receiver, the MRI system may facilitate determine characteristics (e.g., sub-surface characteristics) of an object within the primary magnetic field, for example, by generating image data that may be displayed on an electronic display to provide a visual representation of the characteristics.

As such, accuracy of object characteristics determined using an MRI system may be dependent on being able to precisely control the primary magnetic field. In other words, image capabilities of an MRI system may be affected by electromagnetic interference. For example, when electrical current flows through a conductive material, an additional magnetic field may be generated that interacts with (e.g., distorts) the primary magnetic field, thereby affecting ability of the MRI system to accurately interpret the radio frequency signal received by the radio frequency receiver. To reduce likelihood of electromagnetic interference affecting operation of an MRI system, in some instances, potential sources of electromagnetic interference may be insulated from the primary magnetic field, for example, by implementing a first portion (e.g., the primary magnet, the gradient coils, the radio frequency transmitter, and the radio frequency receiver) in a screened scan room and implementing a second portion outside the screened scan room. However, at least in some instances, implementing an MRI system in this manner may affect implantation associated cost, such as physical footprint of the MRI system.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, this disclosure encompasses a magnetic resonance imaging system including a scanner, and gradient drivers. The scanner is to be implemented within a scan room that is shielded from electromagnetic interference. Gradient coils within the scanner are designed to create a linear gradient in the magnetic field generated in the scanner by a primary magnet. These coils are energized by gradient drivers electrically coupled to a power source.

The gradient drivers use transformers and other electrical devices such as capacitors and resistors in a switching stage configured to generate pulse-width-modulated electrical power for the gradient driver. The transformers may have non-magnetic cores to facilitate implementing the gradient drivers within the scan room.

The gradient drivers also use a filtering stage after the switching stage. The filters use inductors and other electrical devices such as capacitors and resistors to smooth the pulse-width-modulated electrical power before being delivered to the gradient coils. The inductors within the filters may have non-magnetic cores to facilitate implementing the gradient driver within the scan room. Additionally, an inductor with a hollow wire may be used to circulate fluid in order to facilitate cooling the magnetic resonance image system.

In another embodiment, this disclosure encompasses a method for implementing a magnetic resonance imaging system by electrically coupling a transformer with a non-magnetic core in a gradient driver between a switching stage and a filtering stage. This transformer facilitates supplying pulse-width-modulated electrical power to the filtering stage. The filtering stage facilitates smoothing the pulse-width-modulated electrical power and supplying it to a gradient coil. Within the filtering stage there may be inductors with non-magnetic cores. Additionally, there may be one or more inductors with hollow wire that enable fluid flow through within them.

In another embodiment, this disclosure encompasses a switching power amplifier to be implemented in a scan room along with the scanner of a magnetic resonance image system. The switching power amplifier includes a switching stage configured to generate pulse-width-modulated electrical power based at least in part on electrical power received from a power source. The switching stage uses transformers and other electrical devices such as capacitors and resistors. The transformers may have non-magnetic cores to facilitate implementing the switching power amplifier within the scan room.

Also, a filtering stage electrically coupled to the switching stage, is configured to generate smoothed electrical power based at least in part on the pulse-width-modulated electrical power generated by the switching stage. The filtering stage may include one or more inductors with non-magnetic cores, for example air cores, to facilitate implementing the switching power amplifier in the scan room. Additionally, the filtering stage may include an inductor formed from hollow tubing.

BRIEF DESCRIPTION OF THE DRAWINGS

Various aspects of this disclosure may be better understood upon reading the following detailed description and upon reference to the drawings in which.

DETAILED DESCRIPTION

Figure 1:
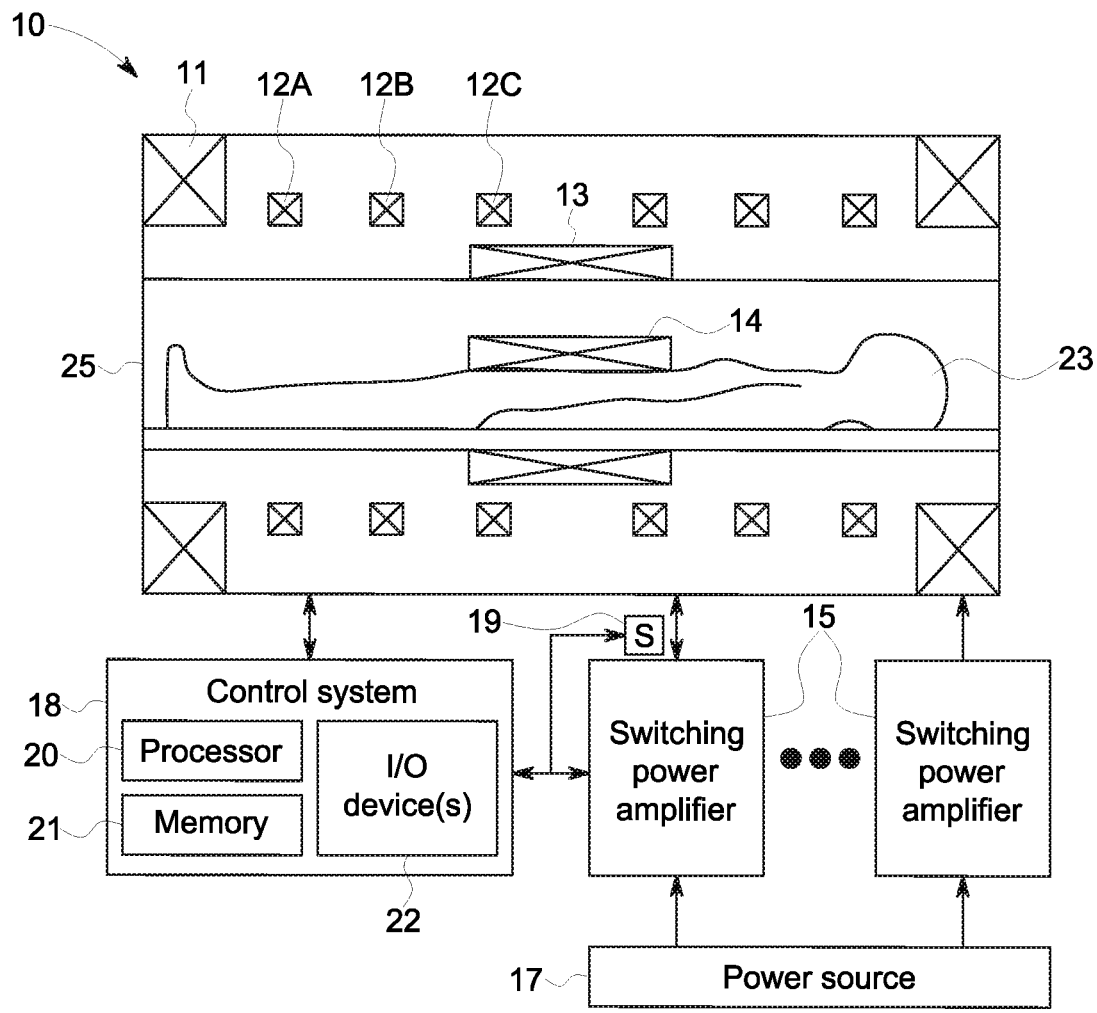
FIG. 1 is a schematic diagram of a magnetic resonance imaging (MRI) system including one or more switching power amplifiers, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to magnetic resonance imaging (MRI) systems and, more particularly, to switching power amplifiers implemented in an MRI system. Generally, an MRI system may provide sub-surface imaging based at least in part on interaction of electromagnetic waves (e.g., radio frequency signal) with a magnetic field. In particular, the MRI system may include a primary magnet that generates a relatively homogenous magnetic field. To facilitate providing reference points, the MRI system may include one or more gradient coils that interact (e.g., create a linear gradient) with the relatively homogenous magnetic field to produce a primary magnetic field including magnetic gradients, for example, along an x-axis, a y-axis, and/or a z-axis. The MRI system may also include one or more radio frequency coils to transmit and receive radio frequency (RF) signals. Based at least in part on the received radio frequency signals, the MRI system may facilitate determining characteristics of an object within a scanner of the MRI system, for example, by generating image data that may be displayed on an electronic display to provide a visual representation of the characteristics.

As such, accuracy of characteristics determined using an MRI system may be dependent on ability of the MRI system to precisely control magnetic field and/or electromagnetic waves within the scanner. Thus, in some instances, the scanner may be implemented insulated from electromagnetic interference, for example, by implementing the scanner within a shielded scan room. In this manner, likelihood of electromagnetic interference affecting the magnetic field and/or electromagnetic waves within the scanner may be reduced.

Moreover, to facilitate precisely controlling the primary magnetic field and/or the transmitted radio frequency signals, an MRI system may include one or more switching power amplifiers (e.g., class-D power amplifiers). For example, the MRI system may include a first switching power amplifier (e.g., radio frequency driver) that outputs an analog electrical signal used by a radio frequency coil (e.g., transmitter) to transmit a radio frequency signal. Additionally or alternatively, the MRI system may include a second switching power amplifier (e.g., gradient driver) that outputs an analog electrical signal used by a gradient coil to create a linear gradient on the relatively homogenous magnetic field generated by the primary magnet.

However, a switching power amplifier may produce electromagnetic interference, for example, due to flow of electrical power through the switching power amplifier and/or magnetic components implemented in the switching power amplifier. As such, in some instances, switching power amplifiers may be implemented outside of the scan room, thereby shielding (e.g., insulating) the scanner from the switching power amplifiers. However, implementing an MRI system in this manner may affect implementation associated cost of the MRI system. For example, switching power amplifiers of the MRI system may be implemented in an equipment room separate from the scan room, thereby resulting in a physical footprint of at least the combined area of the scan room and the equipment room.

Accordingly, as will be described in more detail below, the present disclosure provides techniques to improve implementation of a magnetic resonance imaging (MRI) system, for example, by enabling a switching power amplifier to be implemented alone with the scanner in a scan room. In some embodiments, a switching power amplifier may include electrical devices, such as transformers and/or inductors. When implemented using a magnetic component (e.g., a ferrite core), an electrical device may alter the magnetic field and, thus, interfere with the primary magnetic field when implemented in the scan room. To facilitate implementation in the scan room, in some embodiments, electrical devices in switching power amplifiers of the MRI system may be implemented using non-magnetic components.

For example, a transformer electrically coupled between a switching stage and a filtering stage of a switching power amplifier located in the scan room may be implemented using a non-magnetic (e.g., air) core. Additionally, an inductor included in a filter (e.g., filtering stage) of a switching power amplifier located in the scan room may be implemented using a non-magnetic (e.g., air) core. In fact, in some embodiments, an inductor may be integrated with a cooling system to facilitate cooling the MRI system and/or the scan room. For example, an inductor of the filter may be implemented using an electrically conductive hollow tubing (e.g., a pipe), thereby enabling the cooling system to circulate coolant (e.g., water or refrigerant) through the inductor. In other words, in such embodiments, an inductor of a switching power amplifier located in the scan room may be implemented to serve a dual purpose of storing electrical energy to facilitate precisely controlling an output analog electrical signal and cooling its surrounding environment.

In instances, electromagnetic interference may additionally or alternatively be generated in the scan room due to presence of electrically conductive material. For example, one or more cables may be implemented to electrically couple a switching power amplifier with a power source and/or to electrically couple the switching power amplifier with a load (e.g., a gradient coil or an RF coil). Since a magnetic field is generated when electrical current flows through electrically conductive material, a cable in the scan room may generate an additional magnetic field that potentially interferes with the primary magnetic field and/or the transmitted radio frequency signal. Thus, in some embodiments, a cable shield may be implemented about the cable to reduce likelihood of producing electromagnetic interference that affects accuracy of object characteristics determined via the MRI system.

Moreover, electrical power flowing through electrically conductive material may cause the electrically conductive material to interact with surrounding electrically conductive material. For example, switching a switching power amplifier to control supply of electrical power to a first cable may result in a voltage change (dv/dt) that causes capacitive coupling with a second cable and/or a current change (di/dt) that results in inductive coupling with the second cable. Thus, in some embodiments, a bundle shield may be implemented about a group of multiple cables to reduce likelihood of producing electromagnetic interference that affects accuracy of object characteristics determined via the MRI system. In this manner, the techniques described in the present disclosure may facilitate improving implementation of MRI systems (e.g., by reducing physical footprint) as well as improving operation of MRI systems, for example, by improving accuracy of determined object characteristics.

To help illustrate, an example of a magnetic resonance imaging (MRI) system 10 is shown in FIG. 1. As depicted, the MRI system 10 includes a scanner 25, a control system 10, one or more switching power amplifiers 15, and one or more sensors 19, for example that measure parameters (e.g., temperature, pressure, voltage, and/or current) of the MRI system. It should be appreciated that the depicted embodiment is merely intended to be illustrative and not limiting.

In some embodiments, operation of the MRI system 10 may generally be controlled by a control system 18, for example, including one or more controllers and/or computing devices. To facilitate controlling operation, the control system 18 may include a processor 20, memory 21, and one or more input/output (I/O) devices 22. In some embodiments, the memory 21 may store instructions executable by the processor 20 and/or data to be processed (e.g., analyzed) by the processor 20, for example, to determine image data indicative of characteristics of an object 23 located in the scanner 25. Thus, in some embodiments, the memory 21 may include one or more tangible, non-transitory, computer-readable media, such as random access memory (RAM), read only memory (ROM), rewritable non-volatile memory, flash memory, hard drives, optical discs, and/or the like. Additionally, in some embodiments, the processor 20 may include one or more general purpose microprocessors, one or more application specific processors (ASICs), one or more field programmable logic arrays (FPGAs), or any combination thereof.

Furthermore, in some embodiments, I/O devices 22 may enable the control system 18 to interface with various other electronic devices. For example, the I/O devices 22 may communicatively couple the control system 18 to a communication network, such as a personal area network (PAN), a local area network (LAN), and/or a wide area network (WAN), thereby enabling the control system 18 to communicate with another electronic device communicatively coupled to the communication network. Additionally or alternatively, the I/O devices 22 may communicatively couple the control system 18 to the scanner 25. In this manner, control system 18 may communicate data with the scanner 25, for example, enabling the control system 18 to analyze measurement signals received from the scanner 25.

To facilitate generating the measurement signals, the scanner 25 may include a primary magnet 11, one or more gradient coils 12, a radio frequency transmitter 13, and a radio frequency receiver 14. In particular, as described above, the primary magnet 11 may generate a relatively homogenous magnetic field in the scanner 25. In some embodiments, the primary magnet 11 may include a resistive magnet, a permanent magnet, and/or a superconducting magnet. When the primary magnet 11 includes an electromagnet, the control system 18 may control strength (e.g., magnitude) of the relatively homogenous magnetic field, for example, by controlling supply of electrical power to the primary magnet 11.

Additionally, as described above, the gradient coils 12 may interact (e.g., create a linear gradient in) the relatively homogenous magnetic field to produce a primary magnetic field with magnetic gradients. In some embodiments, the magnetic gradients may be produced to provide reference points in the primary magnetic field. For example, a first gradient coil 12A may produce a magnetic gradient along a first (e.g., x-axis) of the scanner 25, a second gradient coil 12B may produce a magnetic gradient along a second (e.g., y-axis) of the scanner 25, and a third gradient coil 12C may produce a magnetic gradient along a third (e.g., z-axis) of the scanner 25.

Furthermore, as described above, the radio frequency transmitter 13 may transmit a radio frequency (RF) signal into the scanner 25 and the radio frequency receiver 14 may receive RF signals passing through the scanner 25. In some embodiments, the radio frequency transmitter 13 and/or the radio frequency receiver 14 may be implemented using one or more radio frequency (RF) coils. Additionally, in some embodiments, the radio frequency transmitter 13 and the radio frequency receiver 14 may be implemented as a radio frequency transceiver, for example, using the same RF coils. In any case, based at least in part on the RF signals received by the radio frequency receiver 14, the scanner 25 may determine measurement signals that enable the control system 18 to determine characteristics of an object in the scanner 25.

To facilitate improving accuracy of determined object characteristics, the control system 18 may control operation of the radio frequency transmitter 13 and/or the gradient coils 12, for example, by controlling supply of electrical power. In some embodiments, one or more switching power amplifiers 15 may operate (e.g., switch) to supply controllable electrical power from a power source 17 (e.g., electrical grid or battery) to the scanner 25. For example, the MRI system 10 may include a switching power amplifier 15 (e.g., a radio frequency driver) that supplies controllable electrical power to the radio frequency transmitter 13. Additionally or alternatively, the MRI system 10 may include multiple switching power amplifiers 15 (e.g., gradient drivers) that each supplies controllable electrical power to a corresponding gradient coil 12.

Accordingly, to control operation of the radio frequency transmitter 13 and/or the gradient coils 12, the control system 18 may control operation of the switching power amplifiers 15, for example, by controlling switching frequency. To facilitate precisely controlling operation of the radio frequency transmitter 13 and/or the gradient coils 12, in some embodiments, a sensor 19 may measure (e.g., feedback) parameters of electrical power supplied to and/or from a switching power amplifier 15 to enable the control system 18 to adjust operation of the switching power amplifier 15 accordingly. In some embodiments, one or more of the switching power amplifiers 15 may be implemented (e.g., located) in a scan room along with the scanner 25 to facilitate improving implementation of the MRI system 10, for example, by reducing physical footprint.

Figure 2:
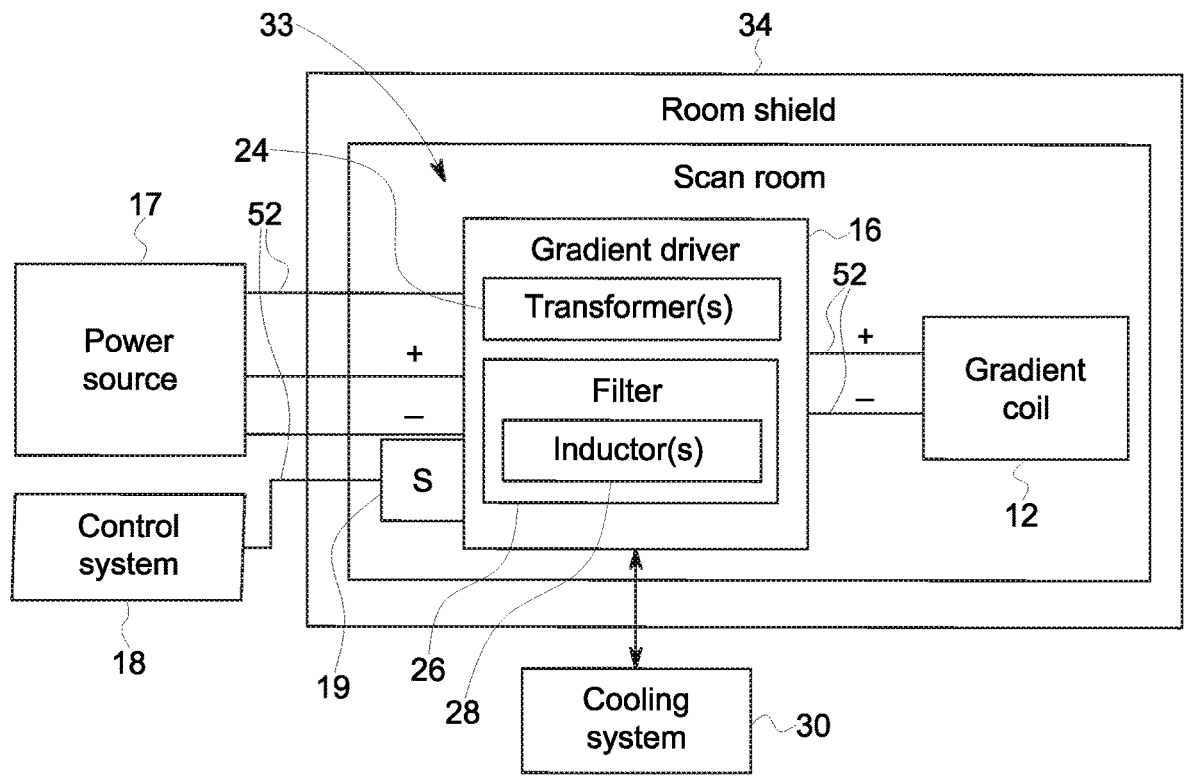
FIG. 2 is a schematic diagram of a portion of the MRI system of FIG. 1 including a switching power amplifier implemented as a gradient driver in a scan room, in accordance with an embodiment of the present disclosure.

To help illustrate, an example of a switching power amplifier 15 implemented in a scan room 33 as a gradient driver 16 is shown in FIG. 2. As described above, electromagnetic interference may affect ability of the MRI system 10 to accurately determine object characteristics. Thus, the scan room 33 may be enclosed by a room shield 34 implemented to shield (e.g., insulate) the scan room 33 from external electromagnetic interference.

Since located outside of the scan room 33, one or more cables 52 (e.g., electrically conductive conduits) may extend through the room shield 34 to electrically couple the power source 17 to the gradient driver 16 and/or communicatively couple the control system 18 to the sensor 19. Additionally, to facilitate supplying electrical power to the gradient coil 12, one or more cables 52 may be electrically coupled between the gradient driver 16 and the gradient coil 12.

To facilitate controlling supply of electrical power to the gradient coil 12, the gradient driver 16 may include a switching stage and a filter 28 (e.g., filtering stage). In particular, the switching stage may pulse width modulate electrical power received from the power source 17. Before being supplied to the gradient coil 12, the filter 28 may smooth the electrical power output by the switching stage. Thus, in some embodiments, the gradient driver 16 may include one or more transformers 24, for example, electrically coupled between the switching stage and the filter 28. To facilitate smoothing the pulse width modulate electrical power output from the switching stage, in some embodiments, the filter 28 may include one or more inductors 26 that operate to store electrical energy.

As described above, in some embodiments, an inductor 28 may be implemented to serve a dual purpose. For example, the inductor 28 may be implemented using hollow electrically conductive tubing. In this manner, a cooling system 30 may utilize the inductor 28 to facilitate cooling the MRI system 10, for example, by circulating coolant (e.g., water or refrigerant) through the hollow interior of the inductor 28.

Figure 3:
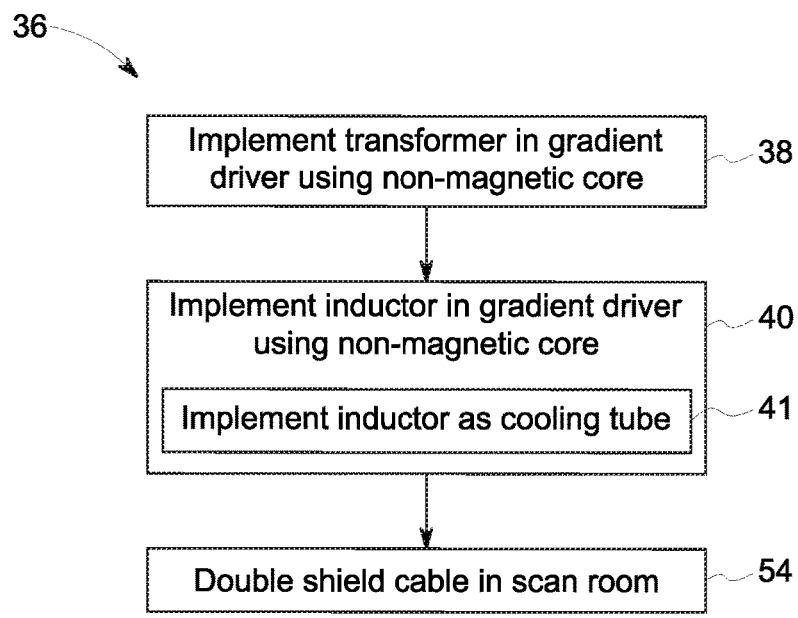
FIG. 3 is a flow diagram describing a process for implementing the gradient driver of FIG. 2, in accordance with an embodiment of the present disclosure.

One embodiment of a process 36 for implementing a gradient driver 16 conducive to being located in a scan room 33 is described in FIG. 3. Generally, the process 36 includes implementing a transformer in a gradient driver using a non-magnetic core (process block 38), implementing an inductor in the gradient driver using a non-magnetic core (process block 40), and double shielding a cable in a scan room (process block 54). In some embodiments, the process 36 may be implemented by a manufacturer of the gradient driver 16 and/or a system integrator of the MRI system 10.

In any case, each transformer 26 in the gradient driver 16 may be implemented using a non-magnetic core (process block 38). In some embodiments, a transformer 26 in the gradient driver 16 may be implemented using an air core. Additionally, each inductor 28 in the gradient driver 16 may be implemented using a non-magnetic core (process block 40). In some embodiments, an inductor 28 in the gradient driver 16 may be implemented using an air core. As described above, in some embodiments, an inductor 28 may also be implemented as cooling tube to facilitate cooling the MRI system 10 (process block 41).

Figure 4:
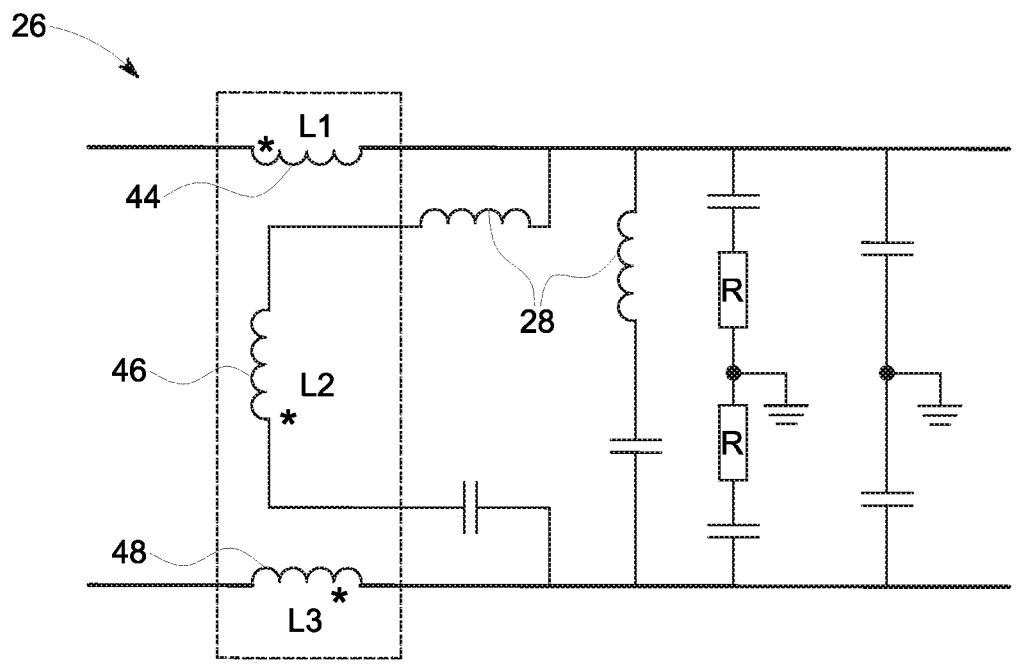
FIG. 4 is a schematic diagram of a filter implemented in the gradient driver of FIG. 3, in accordance with an embodiment of the present disclosure.

To help illustrate, an example circuit diagram of the filter 26 is shown in FIG. 4. It should be appreciated that the depicted circuit diagram is merely intended to be illustrative and not limiting. In other words, the techniques described in the present disclosure may be applicable to filters 26 implemented with varying circuit connections. In any case, in the depicted embodiment, the filter includes a first large inductor 44, a second large inductor 46, and a third large inductor 48 along with other electrical devices (e.g., other inductors 28, capacitors, and/or resistors). In some embodiments, the second large inductor 46 may implemented as a cooling tube. As such, in addition to being electrically coupled to the first large inductor 44 and the second large inductor 46, the second large inductor 46 may be fluidly coupled to the cooling system 30.

Figure 5:
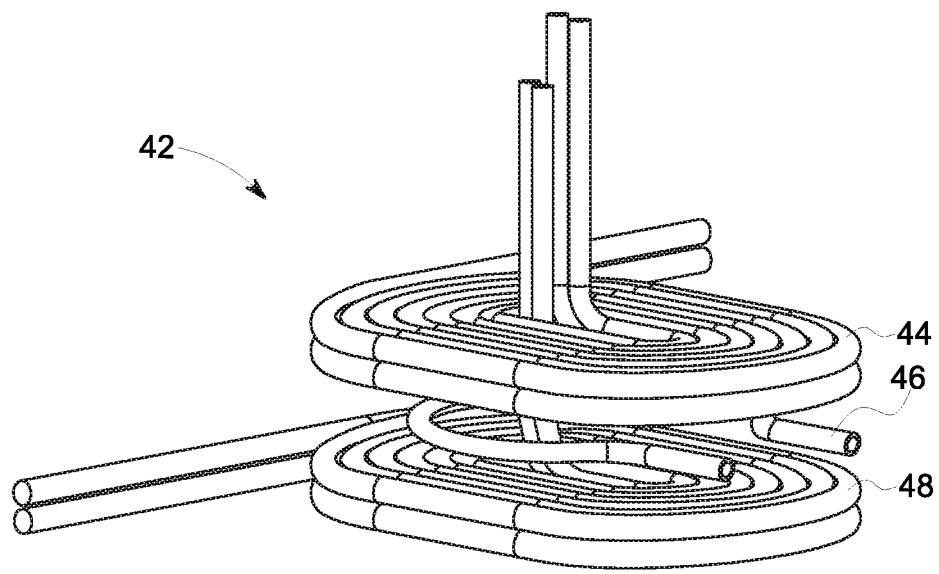
FIG. 5 is a perspective view of inductors implemented in the filter of FIG. 4, in accordance with an embodiment of the present disclosure.

One example implementation of the first large inductor 44, the second large inductor 46, and the third large inductor 48 is shown in FIG. 5. It should be appreciated that the depicted embodiment is merely intended to be illustrative and not limiting. In other words, the techniques described in the present disclosure may be applicable inductors implemented with varying physical configurations.

In any case, the first large inductor 44, the second large inductor 46, and the third large inductor 48 may each be implemented using one or more coils formed from electrically conductive material. However, as depicted, the second large inductor 48 is hollow, which may enable fluid flow through a hollow interior portion of the second large inductor 48. As such, when fluidly coupled to the second large inductor 48, the cooling system 30 may utilize the second large inductor 48 as a cooling tube to facilitate cooling the MRI system 10.

To facilitate cooling efficiency, in some embodiments, a thermally conductive material may be disposed on an exterior surface of the second large inductor 46. For example, a thermally conductive epoxy may be formed between the second large inductor 46 and the first large inductor 44 and/or between the second large inductor 46 and the third large inductor 48. In any cause, implementing an inductor 28 (e.g., second large inductor 46) of an MRI system in this manner may facilitate utilizing the inductor 28 for a dual purpose—namely storing electrical energy (e.g., to facilitate smoothing pulse-width-modulated electrical power) and flow fluid (e.g., coolant to facilitate cooling).

Returning to the process 36 of FIG. 3, each cable 52 (e.g., electrically conductive conduit) in the scan room 54 may be double shielded (process block 54). To implement the double shielding, in some embodiments, a cable shield may be formed about each cable 52, for example, at least along a portion expected to be located in the scan room 33. In this manner, a cable shield may at least partially block magnetic field generated due to flow of electrical current in the scan room 33 from the scanner 25.

Additionally, when multiple cables 52 are present in the scan room, one or more of the cables 52 may be relatively close proximity to other cables 52, for example, when grouped in a cable bundle. In some embodiments, a bundle shield may be formed around each cable bundle, for example, at least along portion a portion expected to be located in the scan room 33. In this manner, a bundle shield may at least partially block electromagnetic interaction (e.g., capacitive coupling and/or inductive coupling) between cables 52 in the scan room 33 from the scanner 25.

Figure 6:
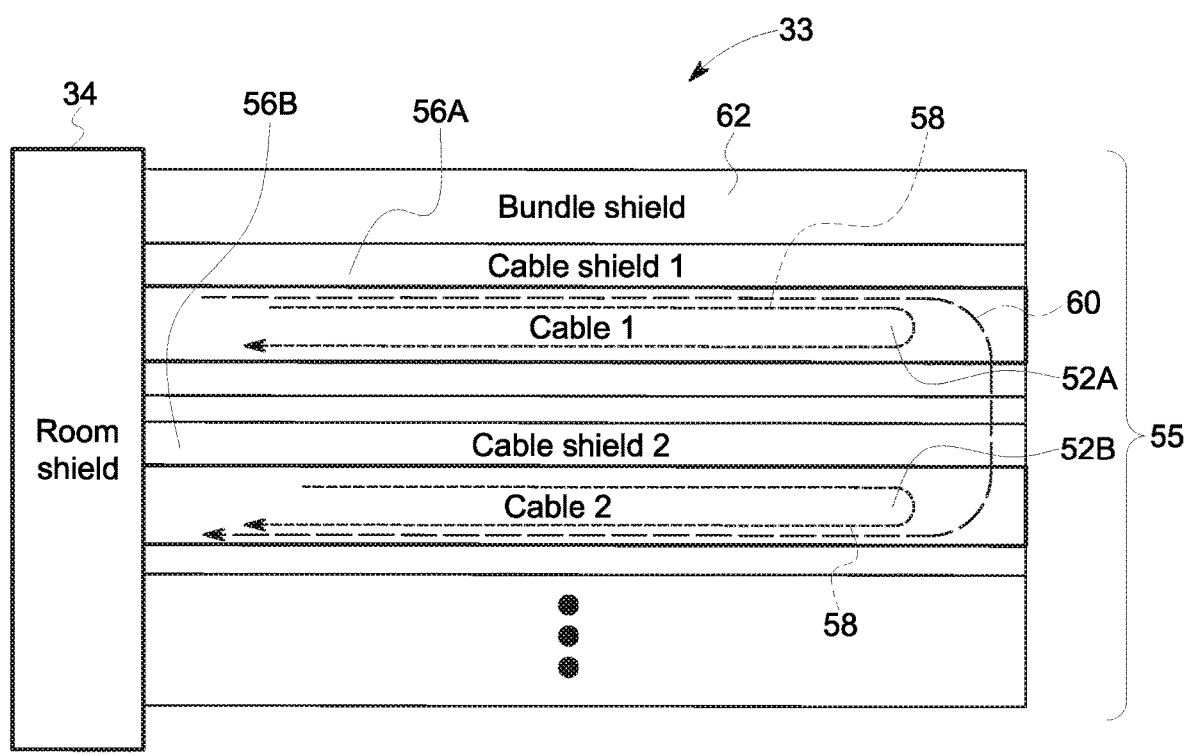
FIG. 6 is a schematic diagram of dual shielding implemented around cables in the scan room of FIG. 2, in accordance with an embodiment of the present disclosure.

To help illustrate, one example of cable bundle 55 located within the scan room 33 is shown in FIG. 6. As depicted, multiple cables 52, including at least a first cable 52A and a second cable 52B, are grouped in the cable bundle 55. For illustrative purposes, the cables 52 of the cable bundle 55 may include any combination of cables 52 electrically coupled between the power source 17 and the gradient driver 16 and/or electrically coupled between the gradient driver 16 and the gradient coil 12. Additionally or alternatively, the cables of the cable bundle may include any combination of cables 52 communicatively coupled between the control system 18 and the gradient driver 16 or the sensor 19.

In any case, as described above, electrical power may flow through cables 52 in the scan room 33, for example, to supply electrical power to the gradient driver 16, to supply electrically power to the gradient coil 12, to communicate signals (e.g., measurement signals and/or command signals) with the control system 18, and/or the like. In particular, an individual cable 52 may potentially produce electromagnetic interference 58, for example, additional magnetic fields due to flow of electrical current through the cable that interact with the primary magnetic field and/or radio frequency (RF signals) transmitted in the scanner 25. Additionally, multiple cables 52 located in relatively close proximity may potentially produce electromagnetic interference 60, for example, capacitive coupling and/or inductive coupling that affects supply of electrical power in the MRI system 10, the primary magnetic field, and/or radio frequency signals transmitted in the scanner 25.

To reduce likelihood of producing electromagnetic interference within the scan room 33, as described above, a cable shield 56 is disposed about (e.g., around) each cable 52 in the cable bundle 55. For example, in the depicted embodiment, a first cable shield 56A is formed around the first cable 52A, a second cable shield 56B is formed around the second cable 52B, and so on. In this manner, each cable shield 56 may reduce likelihood of electromagnetic interference 58 produced by a corresponding cable 52 from propagating to the scanner 25, for example, by reducing magnetic field that radiates from the cable 52.

To further reduce likelihood of producing electromagnetic interference within the scan room 33, as described above, a bundle shield 62 is disposed about (e.g., around) the cable bundle 55. In other words, the bundle shield 62 may be formed about each cable 52 as well as each cable shield 58 implemented in the cable bundle 55. For example, in the depicted embodiment, the bundle shield 62 is formed about at least each of the first cable 52A, the second cable 52B, the first cable shield 56A, and the second cable shield 56B. In this manner, each bundle shield 62 may reduce likelihood of electromagnetic interference 60 produced by a corresponding cable bundle 55 from propagating to the scanner 25, for example, by reducing effect of capacitive coupling and/or inductive coupling between cables 52 propagating beyond the cable bundle 55.

Accordingly, the technical effects of the present disclosure include improving implementation of magnetic resonance imaging (MRI) systems and/or improving operation of MRI systems, for example, by enabling an MRI system to be implemented with reduced physical footprint and/or reducing likelihood of electromagnetic interference affecting determination of object characteristics by the MRI system. To facilitate improving implementation, the present disclosure provides techniques that enable a switching power amplifier (e.g., gradient driver) to be implemented in a scan room, for example, by electrical devices (e.g., inductors and/or transformers) using non-magnetic components (e.g., air cores). To facilitate improving implementation, one or more inductors in the MRI system may be implemented serve a dual purpose, for example, storing electrical energy to facilitate smoothing pulse-width-modulated electrical power and/or flowing fluid to facilitate cooling (e.g., extracting heat) from the MRI system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging system comprising:
 a scanner configured to be implemented within a scan room, wherein the scanner comprises a first gradient coil configured to create a linear gradient in a magnetic field generated in the scanner; and
 a first gradient driver electrically coupled between a power source and the first gradient coil, wherein the first gradient driver is configured to control supply of first electrical power to the first gradient coil and comprises:
  a first transformer electrically coupled between a first filtering stage and a first switching stage configured to generate first pulse-width-modulated electrical power in the first gradient driver based at least in part on electrical power received from the power source, wherein the first transformer comprises a first non-magnetic core to facilitate implementing the first gradient driver within the scan room; and
  a first inductor in the first filtering stage configured to store electrical energy that facilitates generating the first electrical power by smoothing the first pulse-width-modulated electrical power, wherein the first inductor comprises:
   a second non-magnetic core to facilitate implementing the first gradient driver within the scan room; and
   a first hollow-interior configured to enable fluid flow through the first inductor to facilitate cooling the magnetic resonance imaging system.

2. The magnetic resonance imaging system of claim 1, comprising a control system communicatively coupled to the scanner, wherein:
 the scanner comprises:
  a primary magnet configured to generate the magnetic field;
  a radio frequency transmitter configured transmit one or more radio frequency signals into the magnetic field; and
  a radio frequency receiver configured to receive a radio frequency signal passing through the magnetic field; and
 the control system is configured to determine image data indicative of a characteristic of any objects within the scanner based at least in part on the radio frequency signal received by the radio frequency receiver to facilitate displaying a visual representation of the characteristic.

3. The magnetic resonance imaging system of claim 1, comprising a cable bundle, wherein the cable bundle comprises:
- a first cable configured to be electrically coupled to the first gradient driver to facilitate supply of the first electrical power to the gradient coil;
- a second cable configured to be electrically coupled to the first gradient driver to facilitate supply of the first electrical power to the gradient coil;
- a first cable shield formed about the first cable to facilitate insulating the scanner from first electromagnetic interference produced by the first cable when the first cable is implemented in the scan room;
- a second cable shield formed about the second cable to facilitate insulate the scanner from second electromagnetic interference produced by the second cable when the second cable is implemented in the scan room; and
- a cable shield formed about the first cable, the second cable, the first cable shield, and the second cable shield to facilitate insulating the scanner from third electromagnetic interference produced by the cable bundle when the cable bundle is implemented in the scan room.

4. The magnetic resonance imaging system of claim 1, comprising a cooling system fluidly coupled to the first inductor, wherein the cooling system is configured to circulate a cooling fluid through the first hollow-interior of the first inductor to facilitate extracting heat from the magnetic resonance imaging system.

5. The magnetic resonance imaging system of claim 1, wherein the first gradient driver comprises a second inductor electrically coupled between the first transformer and the first inductor, wherein:
- the second inductor comprises a third non-magnetic core; and
- the second inductor is physically coupled to the first inductor on a first side via thermally conductive epoxy to facilitate heat transfer between the second inductor and the first inductor.

6. The magnetic resonance imaging system of claim 5, wherein the first gradient driver comprises a third inductor, wherein:
- the first inductor is electrically coupled between the second inductor and the third inductor; the third inductor comprises a fourth non-magnetic core; and
- the third inductor is physically coupled to the first inductor a second side opposite the first side via thermally conductive epoxy to facilitate heat transfer between the third inductor and the first inductor.

7. The magnetic resonance imaging system of claim 1, wherein:
- the scanner comprises a second gradient coil configured to create a linear gradient in the magnetic field along a first axis of the scanner, wherein the first gradient coil is configured to create a linear gradient in the magnetic field along a second axis different from the first axis; and
- the magnetic resonance imaging system comprises a second gradient driver electrically coupled between the power source and the second gradient coil, wherein the second gradient driver is configured to control supply of second electrical power to the second gradient coil and comprises:
    - a second transformer electrically coupled between a second filtering stage and a second switching stage configured to generate second pulse-width-modulated electrical power in the second gradient driver based at least in part on electrical power received from the power source, wherein the second transformer comprises a third non-magnetic core to facilitate implementing the second gradient driver within the scan room; and
    - a second inductor in the second filtering stage configured to store electrical energy that facilitates generating the second electrical power by smoothing the second pulse-width-modulated electrical power, wherein the second inductor comprises:
        - a fourth non-magnetic core to facilitate implementing the second gradient driver within the scan room; and
        - a second hollow-interior configured to enable fluid flow through the second inductor to facilitate cooling the magnetic resonance image system.

8. The magnetic resonance imaging system of claim 1, wherein:
- the scan room is enclosed by a room shield configured to shield the scanner from electromagnetic interference generated external the scan room; and
- the first gradient driver is configured to be implemented within the room shield along with the scanner.

* * * * *